United States Patent

Franosch et al.

Patent Number: 6,022,786
Date of Patent: Feb. 8, 2000

[54] METHOD FOR MANUFACTURING A CAPACITOR FOR A SEMICONDUCTOR ARRANGEMENT

[75] Inventors: Martin Franosch, Munich; Wolfgang Hoenlein, Unterhaching, both of Germany; Helmut Klose, Poughkeepsie, N.Y.; Gerrit Lange; Volker Lehmann, both of Munich, Germany; Hans Reisinger, Gruenwald, Germany; Herbert Schaefer, Brunn, Germany; Reinhard Stengl, Stadtbergen, Germany; Hermann Wendt, Grasbrunn, Germany; Dietrich Widmann, Unterhaching, Germany

[73] Assignee: Siemens Aktiengesellschaft, Munich, Germany

[21] Appl. No.: 09/032,484

[22] Filed: Feb. 27, 1998

[30] Foreign Application Priority Data

Feb. 27, 1997 [DE] Germany ............. 197 07 978

[51] Int. Cl.⁷ ..................................... H01L 21/20
[52] U.S. Cl. ..................... 438/398; 438/397; 361/313
[58] Field of Search .................... 438/246, 241, 438/381, 386, 397, 398; 361/313

[56] References Cited

U.S. PATENT DOCUMENTS 5,155,657  10/1992  Oehrlein et al. ................ 361/313
5,168,073  12/1992  Gonzalez et al. .

FOREIGN PATENT DOCUMENTS

| | | |
|---|---|---|
| 000539685A1 | 8/1992 | European Pat. Off. . |
| 42 38 081 A1 | 7/1993 | Germany . |
| 195 26 952 A1 | 1/1997 | Germany . |
| 410242429A | 2/1998 | Japan . |
| 2 285 338 | 5/1995 | United Kingdom . |

OTHER PUBLICATIONS

Patent Abstracts of Japan Publication No. 042 085 28—Publication date Jul. 30, 1992—Okamoto Tetsumasa.

*Primary Examiner*—Chandra Chaudhari
*Assistant Examiner*—Craig Thompson
*Attorney, Agent, or Firm*—Hill & Simpson

[57] ABSTRACT

For manufacturing a capacitor, in particular for a dynamic memory cell arrangement, a trench is etched in a substrate. In the trench, a layer sequence is produced that contains, in alternating fashion, layers of doped silicon and germanium-containing layers. By anisotropic etching, the surface of the semiconductor substrate (12) is exposed in the region of the trench floor. The trenches are filled with a conductive support structure (20). The germanium-containing layers are removed selectively to the layers of doped silicon. The exposed surface of the layers of doped silicon (17) and of the support structure (20) are provided with a capacitor dielectric (22), onto which is applied a counter-electrode (23).

13 Claims, 3 Drawing Sheets

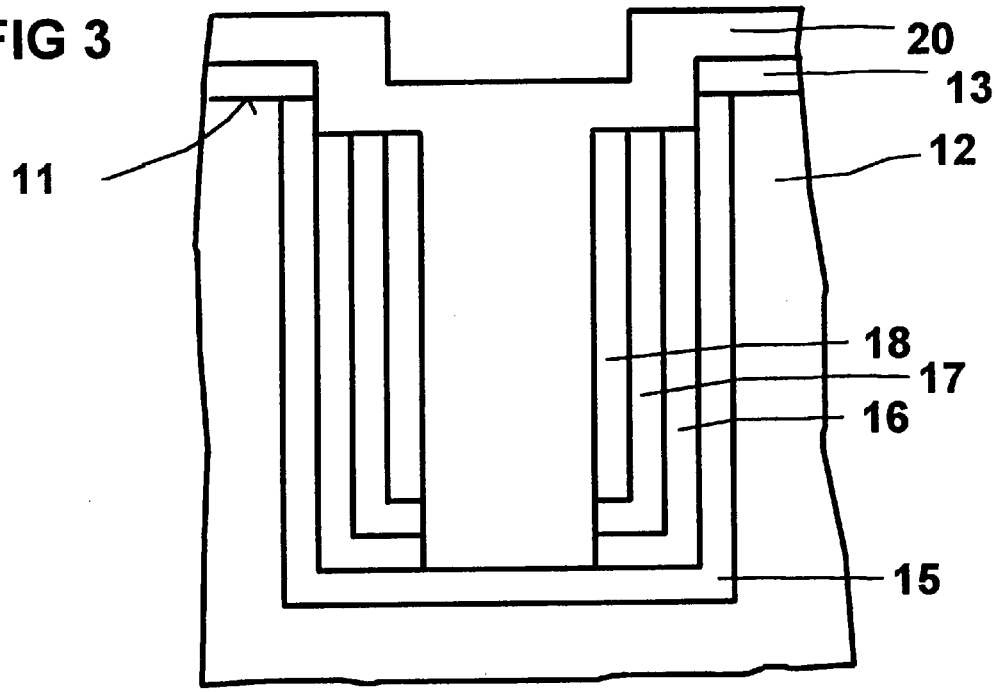
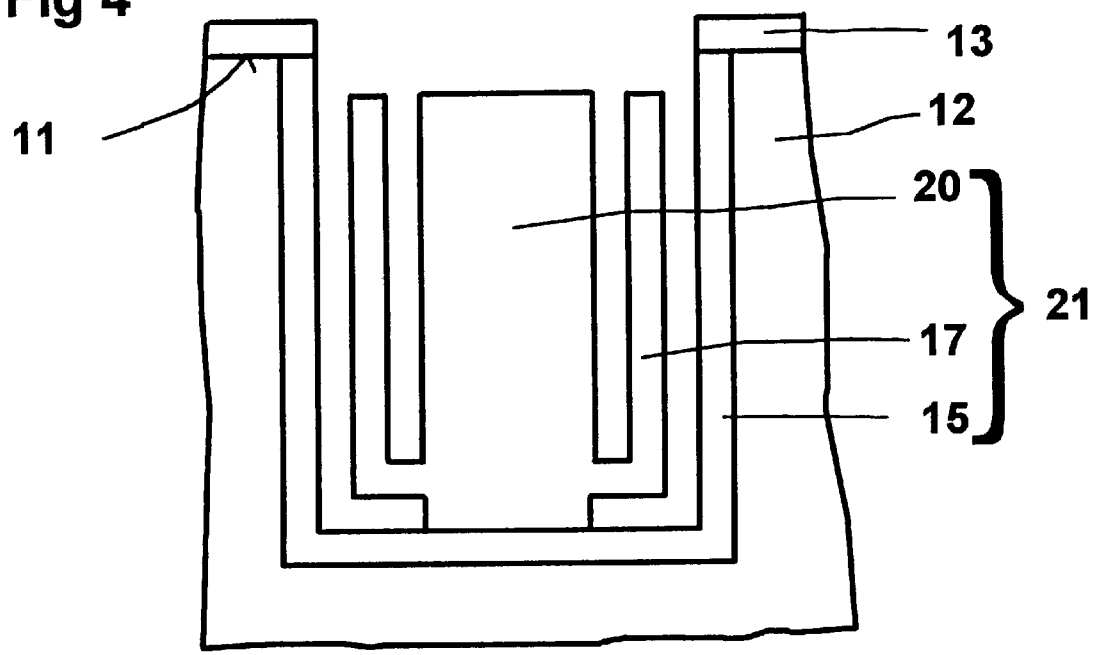

METHOD FOR MANUFACTURING A CAPACITOR FOR A SEMICONDUCTOR ARRANGEMENT

BACKGROUND OF THE INVENTION

Semiconductor-based capacitors are required for various integrated circuit types, such as for example dynamic memory cell arrangements, analog-digital and digital-analog converters, as well as filter circuits. In the manufacturing of capacitors on a semiconductor basis, with regard to an increased integration density or reduced chip surface, the problem must be solved of reducing the space requirement of the capacitor while the capacitance remains constant.

This problem is particularly serious in dynamic semiconductor memories, in which the required surface of the one-transistor memory cell generally used is reduced from memory generation to memory generation, with increasing storage density. At the same time, a certain minimum capacitance of the memory capacitor must be maintained.

A one-transistor memory cell of a dynamic semiconductor memory arrangement (DRAM memory arrangement) has a read-out transistor and a capacitor. In the capacitor, the information is stored in the form of an electrical charge that represents a logical variable, zero or one. By controlling the read-out transistor via a wordline, this information can be read out via a bitline. For the secure storing of the charge and the simultaneous distinguishability of the information read out, the capacitor must have a minimum capacitance. The lower limit for the capacitance of the storage capacitor is currently regarded as 25 fF.

Up to the 1 Mbit generation, both the read-out transistor and the capacitor were realized as planar components. Starting with the 4 Mbit memory generation, a further surface reduction of the memory cell was achieved by means of a three-dimensional arrangement of the read-out transistor and the storage capacitor. A possibility for this is to realize the storage capacitor in a trench (see for example K. Yamada et al., Proc. Intern. Electronic Devices and Materials IEDM 85, pp. 702ff.). In this case, the electrodes of the storage capacitor are arranged along the surface of the trench. By this means, the effective surface of the storage capacitor, on which the capacitance depends, is increased in relation to the space requirement on the surface of the substrate for the storage capacitor, which corresponds to the cross-section of the trench.

A further possibility for increasing storage capacity while the space requirement of the storage capacitor remains constant or is reduced is in the construction of the storage capacitor as a stacked capacitor. A structure made of polysilicon, e.g. a structure or a cylinder, which is contacted with the substrate, is thereby formed over the wordlines. This polysilicon structure forms the storage node. It is provided with a capacitor dielectric and a capacitor plate. This design has the advantage that it is largely compatible with a logic process.

For the storage capacitor, the open space above the substrate surface is used. The overall cell surface can thereby be covered by the polysilicon structure, as long as the polysilicon structures at adjacent memory cells are insulated against one another.

European reference EP 0 415 530 B1 discloses a memory cell arrangement with a stacked capacitor as a storage capacitor. The stacked capacitor has a polysilicon structure with several polysilicon layers, essentially arranged in parallel one over the other, which are connected with one another via at least one lateral support. These layers, arranged in the manner of cooling fins, lead to a significant increase of the surface of the polysilicon structure in relation to the projection of the polysilicon structure on the substrate surface. The polysilicon structure is formed by: alternating deposition of polysilicon layers and $SiO_2$ layers, which can be etched selectively, on the surface of the substrate; structuring these layers; producing edge coverings (spacers), made of polysilicon, on at least one edge of the layer structure; and selectively etching out the $SiO_2$ layers.

The surface for a memory cell of a DRAM in the 1 Gbit generation should be only about 0.2 $\mu m^2$. In order to realize on such a surface the minimum capacitance of 25 fF for the storage capacitor, given a trench capacitor design, the active trench depth must be at least 4 $\mu m$, given a trench width of 0.2×0.25 $\mu m^2$ and a dielectric with an oxide-equivalent thickness of 5 nm. Trenches with such dimensions can be realized only in expensive etching processes with long etching times. In a stacked capacitor design, these demands on the surface requirement of a memory cell can be produced only with a relatively complicated structure of the polysilicon structure. In addition, these complicated structures are made ever more difficult to manufacture by their topology.

German reference DE 195 26 952 A1 discloses a method for manufacturing a DRAM memory cell arrangement in which the capacitor is fashioned as a trench capacitor with an enlarged surface. For this purpose, in a trench a sequence of alternating layers is formed, which consist of $p^+$-doped or, respectively, $p^-$-doped polysilicon. In the center of the trench, a supporting structure is formed that connects the layers of $p^+$-doped polysilicon with one another mechanically and electrically. Subsequently, the layers of $p^-$-doped polysilicon are selectively removed. Since the selectivity of the etching process thereby used is strongly dependent on the concentration of dopant, the method is limited to low process temperatures, at which a diffusion out from one another of the dopant profiles in the layer sequence is avoided.

SUMMARY OF THE INVENTION

It is an object of the present invention to provide a method for manufacturing a capacitor for a semiconductor arrangement, in particular for a DRAM arrangement, in which the process expense is reduced in relation to the known solutions. In particular, the capacitors should be capable of being manufactured at least in the packing density required for the 1 Gbit generation.

In the method, a trench is etched for the capacitor in a main surface of the semiconductor substrate. As a semiconductor substrate, for example a monocrystalline silicon disk or the monocrystalline silicon layer of an SOI substrate is used. At least in the trench, a layer sequence is deposited that respectively comprises a layer of doped silicon and a layer containing germanium. The layers of doped silicon can be both n-doped and also p-doped. The layers of doped silicon and the germanium-containing layers can be deposited both in polycrystalline fashion and also epitaxially. The layer sequence can comprise arbitrarily many germanium-containing layers and layers of doped silicon. They must comprise at least one germanium-containing layer.

In the center of the trench, parts of the layers arranged on the floor of the trench are removed by means of anisotropic back-etching of the layer sequence. The layer parts arranged along the edges of the trench thereby remain, in the manner of a spacer. By means of subsequent depositing of an electrically conductive layer, e.g. made of doped silicon of the same conductivity type as the layers of doped silicon, a support structure is formed. The support structure extends up to the floor of the trench.

The germanium-containing layers are removed by means of selective etching. The etching is selective to the layers of doped silicon and the support structure. By this means, an electrode structure, assembled from the layers of doped silicon and the support structure, is formed.

The support structure is connected electrically and mechanically with all the layers of doped silicon, so that after the removal of the germanium-containing layers the assembled electrode structure results.

The surface of the electrode structure, which is enlarged in its manufacturing in relation to the cross-section of the trench, is provided with a capacitor dielectric on whose surface a counter-electrode is formed.

Preferably, the layers of doped silicon are formed in a CVD process using silane as a process gas, in a temperature range between 400 and 600° C., at a pressure between 10 and 400 Torr, and a silane flow of 30 to 300 sccm, with deposition rates of 10 to 100 nm per minute. The germanium-containing layers are preferably formed by means of CVD deposition, using germane or, respectively, germane and disilane in the process gas, at a temperature between 400 and 600° C., and a pressure between 10 and 400 Torr, whereby the germane flow and, if warranted, the disilane flow, is set between 30 and 300 sccm, and the deposition rate lies between 10 and 100 nm per minute.

The layers of doped silicon are preferably deposited doped in situ. For this purpose, a doping gas, e.g. arsine, phosphine, or diborane, is the depositing. The layers of doped silicon and the support structure can be formed both from n-doped and also from p-doped silicon.

Doped silicon and germanium can be deposited in the same reactor. By this means, the layer sequence can be realized without changing equipment, merely by changing the process parameters. This means a considerable simplification of the process.

It is within the scope of the present invention to form the germanium-containing layers from pure germanium or from silicon and germanium. If the layers are formed from silicon and germanium, the germanium portion preferably lies between 10 percent and 100 percent. The silicon portion lies between 0 percent and 90 percent. The germanium-containing layers can be deposited both doped and also undoped.

Germanium-containing layers made of pure germanium or of silicon and germanium can be wet-chemically etched with good selectivity to silicon. With the use of an etching mixture containing HF, $H_2O_2$ and $CH_3COOH$, the selectivity of the etching to silicon is from 1:30 to 1:1000. In this etching, the selectivity to silicon oxide and silicon nitride is about 1:30 to 1:1000. With choline, silicon layers can be etched selectively to germanium.

Since the diffusion coefficients of germanium in silicon and of silicon in germanium are extremely low, the layer sequence is maintained unmodified even given process-caused temperature loads of e.g. 800° C. At a process temperature of 1000° C., the diffusion coefficients are thereby approximately at $1.5 \times 10^{-16}$ cm$^2$/sec. For comparison: these diffusion coefficients are thus lower by about a factor of 10 than the diffusion coefficient of boron in silicon.

A further enlargement of the effective surface of the capacitor is achieved in that a doped region is formed on the surface of the trench. The region is connected electrically and mechanically with the support structure, and which is likewise a component of the electrode structure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 3 shows the substrate after whole-surface deposition of a doped polysilicon layer;

FIG. 4 shows the substrate after back-etching of the doped polysilicon layer and selective etching of germanium-containing layers of the layer construction;

DESCRIPTION OF THE PREFERRED EMBODIMENTS

Figure 1:
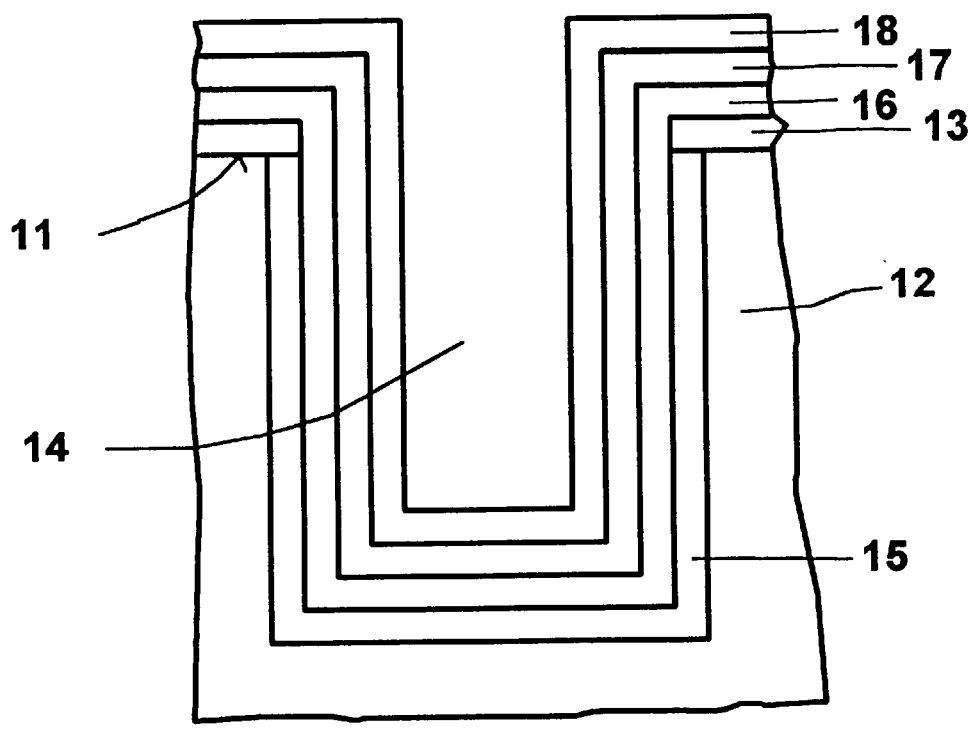
FIG. 1 shows a substrate in which a trench is etched and on which a layer sequence is deposited.

On a main surface 11 of a substrate 12, made for example of n-doped monocrystalline silicon with a dopant concentration of $5 \times 10^{15}$ cm$^{-3}$, a trench mask 13 is formed (see FIG. 1). The trench mask 13 is for example formed by depositing an $SiO_2$ layer in a TEOS method, in a layer thickness of 500 nm, and subsequent structuring of the $SiO_2$ layer.

Using the trench mask 13 as an etching mask, a trench 14 is etched in an anisotropic etching process, for example using $C_2/O_2$. The trench 14 comprises a diameter of for example 0.2 μm and a depth of for example 2.5 μm.

By means of diffusion, a doped region 15 is formed in the substrate 12, the region bordering on the trench 14. The doped region 15 is n$^+$- or p$^+$-doped, and comprises a dopant concentration of e.g. $1 \times 10^{20}$ cm$^{-3}$.

A first germanium-containing layer 16, a layer of doped silicon 17 and a second germanium-containing layer 18 are respectively deposited over the whole surface, with conformal edge covering. The first germanium-containing layer 16 is deposited in a layer thickness of e.g. 25 nm. The layer of doped silicon 17 is deposited in a layer thickness of 25 nm, and with a dopant concentration of e.g. $5 \times 10^{20}$ cm$^{-3}$. It comprises the same conductivity type as the doped region 15. The second germanium-containing layer 18 is deposited in a layer thickness of e.g. 25 nm. The layer construction consisting of the first germanium-containing layer 16, the layer of doped silicon 17 and the second germanium-containing layer 18 is fashioned by means of CVD deposition in one and the same reactor, using silane, disilane and germane as process gases. In the deposition of the layer of doped silicon 17, for in situ doped deposition a doping gas, e.g. phosphine or diborane, is added, and the flow of germane is reduced to zero.

Figure 2:
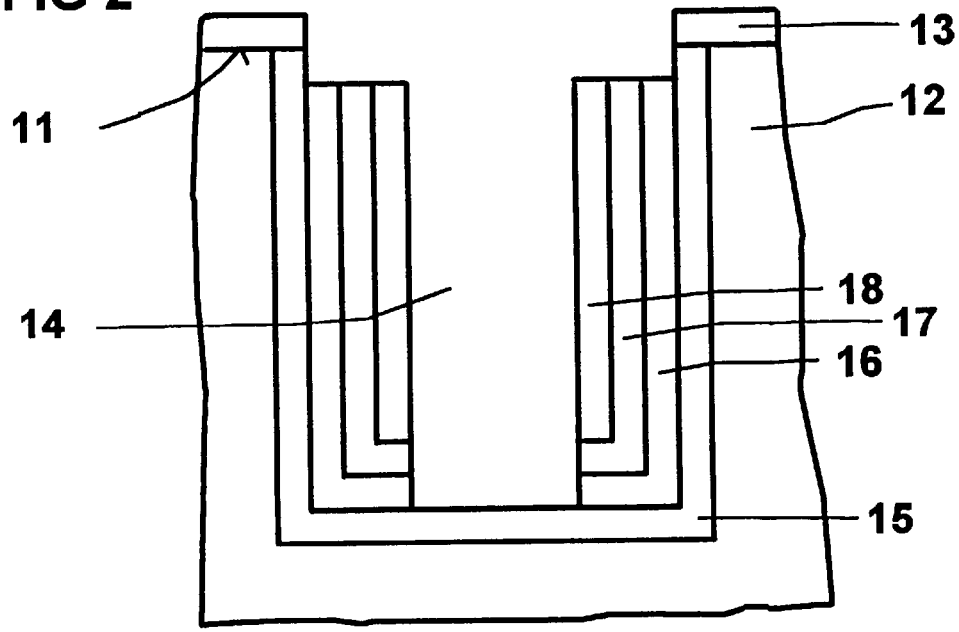
FIG. 2 shows the substrate after anisotropic back-etching of the layer sequence, whereby the trench floor is partly exposed.

By means of anisotropic back-etching, e.g. with $Cl_2/O_2$, parts of the layer construction 16, 17, 18 parallel to the main surface 11 are subsequently removed. The surface of the trench mask 13 is thereby exposed. On the floor of the trench 14, the surface of the doped region 15 is exposed. Similar to the case of a spacer etching, in the anisotropic etching there remain parts of the germanium-containing layers 16, 18 arranged along the edges of the trench 14 perpendicular to the main surface 11, and of the layer of doped silicon 17 (see FIG. 2). In the upper region of the trench 14, a surface of the germanium-containing layers 16, 18 and of the layer of doped silicon 17 is respectively exposed. The etching ensues in a self-adjusting manner, i.e. without a mask.

A doped polysilicon layer 20 with essentially conformal edge covering is deposited. The doped polysilicon layer 20 comprises the same conductivity type as the layer of doped silicon 17, and a dopant concentration of e.g. $5 \times 10^{20}$ cm$^{-3}$. With the doped polysilicon layer 20, the inner trench region is completely filled. The doped polysilicon layer 20 is deposited in a thickness of e.g. 50 nm (see FIG. 3).

By means of back-etching of the doped polysilicon layer 20, e.g. with $Cl_2/O_2$, parts of the doped polysilicon layer 20 arranged on the trench mask 13 are removed. The back-etching is continued until the surface of the germanium-containing layers 16, 18 is exposed in the upper region of the trench 14. By means of an etching selective to doped polysilicon and silicon, the remaining parts of the first germanium-containing layer 16 and of the second germanium-containing layer 18 are subsequently removed. The selective etching ensues e.g. wet-chemically, with an etching mixture containing HF, $H_2O_2$ and $CH_3COOH$. The concentration of the solution preferably lies in the following range: 1 part HF, 200 parts $H_2O_2$, 300 parts $CH_3COOH$. In relation to doped polysilicon, this etching comprises a selectivity of 1:30 to 1:1000. In relation to silicon oxide and silicon nitride, it comprises a selectivity of 1:30 to 1:1000. In relation to silicon oxide and silicon nitride, it comprises a selectivity of 1:30 to 1:1000.

This etching ensues selectively to the trench mask 13. In this etching, neither the remaining parts of the layer of doped silicon 17 and of the doped polysilicon layer 20 nor the surface of the doped region 15 are attacked. After the etching, there remains in the trench 14 an electrode structure 21, which is assembled from the doped layer 15, the remaining parts of the layer of doped silicon 17, and the doped polysilicon layer 20. The doped region 15 and the remaining parts of the layer of doped silicon 17 thereby form two lamella elements that are arranged in one another in bulbi-form manner. The remaining parts of the doped polysilicon layer 20 form a rod-shaped support element that is arranged inside the lamella elements. In the region of the trench floor, the lamella elements and the support element are connected with one another by means of the part of the doped poly-silicon layer 20 arranged there. In the region of the trench walls, spacings have arisen between the remaining parts of the layer of doped silicon 17, the doped polysilicon layer 20, and the doped region 15, by means of the etching out of the germanium-containing layers 16, 18 (see FIG. 4). The cylindrical shape of the layer of doped silicon 17 provides for a sufficient mechanical stability of the electrode layers, so that a sticking together of adjacent layers is avoided during the drying out after the etching.

Figure 5:
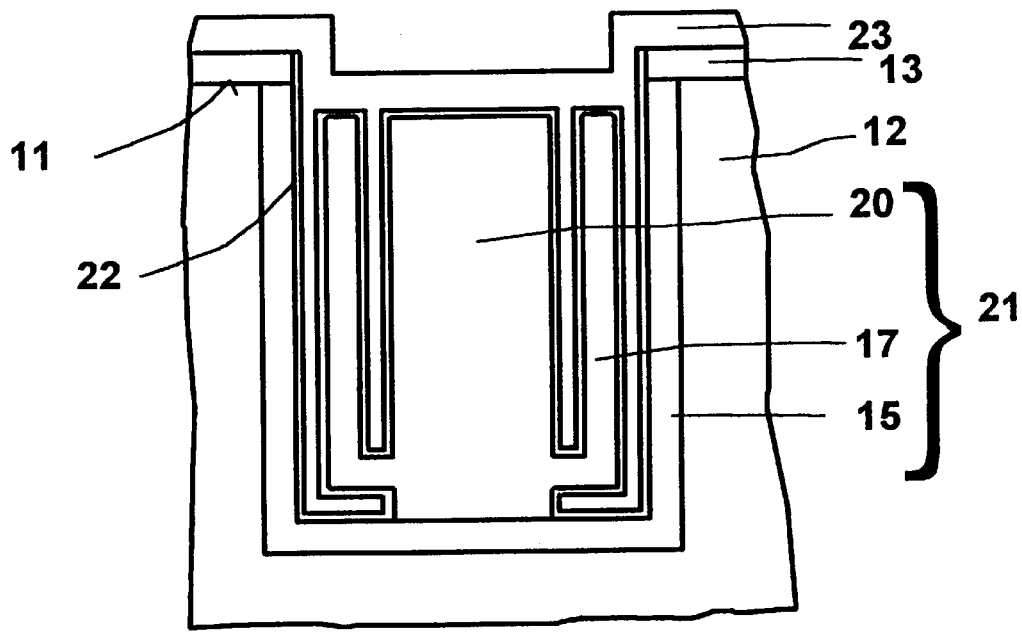
FIG. 5 shows the substrate after the formation of a capacitor dielectric and a counter-electrode.

The surface of the electrode structure 21 is subsequently provided with a storage dielectric 22. The storage dielectric 22 is produced in a layer thickness of for example 7 nm. The storage dielectric 22 contains $SiO_2$ and/or $Si_3N_4$. Preferably, the storage dielectric 22 is fashioned as a multiple layer with a first $SiO_2$ layer in a thickness of 1.5 nm, an $Si_3N_4$ layer in a thickness of 5 nm, and a second $SiO_2$ layer in a thickness of 1.5 nm. For the production of a counter-electrode 23, a doped polysilicon layer 23 is subsequently deposited over the whole surface; said layer comprises an essentially conformal edge covering, and fills the spaces between the doped region 15 and the remaining parts of the layer of doped silicon 17 or, respectively, between the parts of the layer of doped silicon 17 and the doped polysilicon layer 20 (see FIG. 5). Given a trench depth of only 2.5 µm and a trench diameter of 0.2 µm, the storage capacitor formed from the electrode structure 21, the storage dielectric 22 and the counter-electrode 23 comprises a capacitance of greater than 25 fF.

Figure 6:
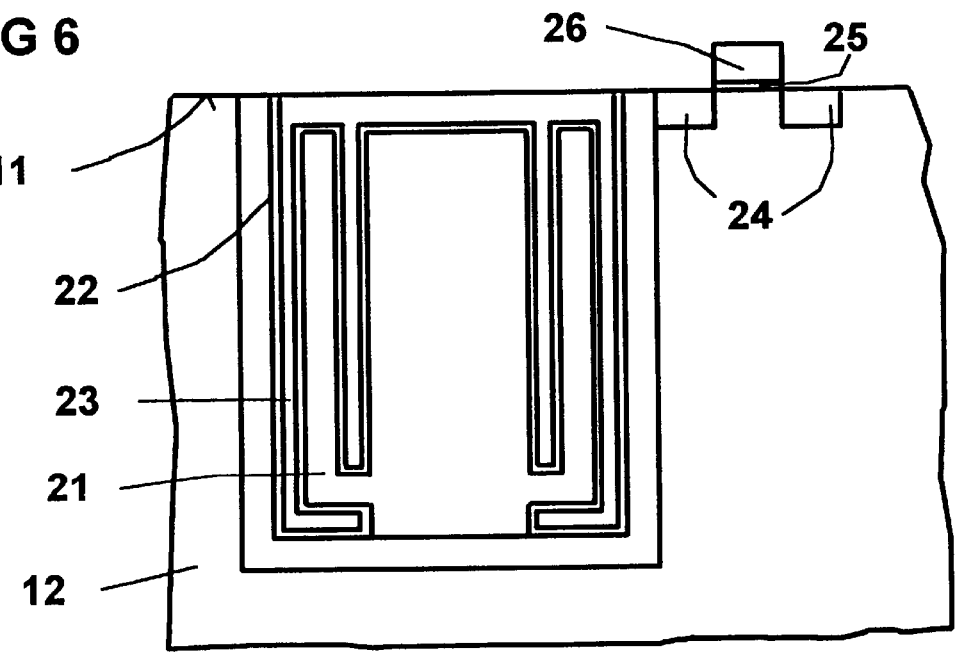
FIG. 6 shows a finished storage capacitor with a selection transistor.

In a DRAM cell arrangement, one storage capacitor is provided per memory cell. In addition, each memory cell comprises a selection transistor with source/drain regions 24, a gate oxide 25 and a gate electrode 26, which is arranged for example as a planar MOS transistor in the region of the main surface 11 next to the storage capacitor (see FIG. 6). The electrode structure 21, which forms the storage node of the storage capacitor, is thereby connected with one of the source/drain regions 24. The other of the source/drain regions 24 is connected with a bitline, and the gate electrode 26 is connected with a wordline. The memory cells are mostly arranged in the form of rows and columns, in the manner of a matrix.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a capacitor for a semiconductor arrangement, comprising the steps of:

etching a trench in a main surface of a semiconductor substrate;

depositing, at least in the trench, a layer sequence having alternating layers of a doped silicon layer and a germanium-containing layer, the layers of the layer sequence being deposited in a common reactor;

exposing by anisotropic etching the surface of the semiconductor substrate in a region of the trench floor;

forming a support structure that extends up to a floor of the trench by whole-surface deposition of an electrically conductive layer that fills the trench, and by anisotropic back-etching of the electrically conductive layer;

removing the germanium-containing layers by selective etching to the layers of doped silicon and the support structure;

providing an exposed surface of the layers of doped silicon and the support structure with a capacitor dielectric; and forming a counter-electrode on a surface of the capacitor dielectric.

2. The method according to claim 1, wherein the layer sequence in the trench is produced by whole-surface deposition of the layers in the layer sequence;

wherein parts of the layers, in the layer sequence, parallel to the main surface are subsequently removed by anisotropic etching, whereby the surface of the semiconductor substrate is exposed in the region of the trench floor; and wherein the support structure is formed by whole-surface deposition of an electrically conductive layer that respectively fills the trenches, and by anisotropic back-etching of the electrically conductive layer.

3. The method according to claim 1, wherein the layers of doped silicon are formed by in situ doped deposition of polysilicon, and wherein the germanium-containing layers are formed by deposition of germanium.

4. The method according to claim 1, wherein each of the germanium-containing layers consists of a germanium portion between 10 and 100 mol %, and a silicon portion between 90 and 0 mol %.

5. The method according to claim 1, wherein, before application of the layer sequence, a doped region is formed in a surface of the trench, said doped region being connected electrically and mechanically with the support structure.

6. A method for manufacturing a capacitor for a semiconductor arrangement, comprising the steps of:

etching a trench in a main surface of a semiconductor substrate;

depositing, at least in the trench, a layer sequence having alternating layers of a doped silicon layer and a germanium-containing layer, the layers o f the layer sequence being deposited in a common reactor, the layer sequence in the trench being produced by whole-surface deposition of the layers in the layer sequence;

exposing by anisotropic etching the surface of the semiconductor substrate in a region of the trench floor;

forming a support structure that extends up to a floor of the trench by whole-surface deposition of an electrically conductive layer that fills the trench, and by anisotropic back-etching of the electrically conductive layer;

removing the germanium-containing layers by selective etching to the layers of doped silicon and the support structure;

providing an exposed surface of the layers of doped silicon and the support structure with a capacitor dielectric;

forming a counter-electrode on a surface of the capacitor dielectric; and wherein parts of the layers, in the layer sequence, parallel to the main surface are subsequently removed by anisotropic etching, whereby the surface of the semiconductor substrate is exposed in the region of the trench floor.

7. The method according to claim 6, wherein the layers of doped silicon are formed by in situ doped deposition of polysilicon, and wherein the germanium-containing layers are formed by deposition of germanium.

8. The method according to claim 6, wherein each of the germanium-containing layers consists of a germanium portion between 10 and 100 mol %, and a silicon portion between 90 and 0 mol %.

9. The method according to claim 6, wherein, before application of the layer sequence, a doped region is formed in a surface of the trench, said doped region being connected electrically and mechanically with the support structure.

10. A method for manufacturing a capacitor for a semiconductor arrangement, comprising the steps of:

etching a trench in a main surface of a semiconductor substrate;

depositing, at least in the trench, a layer sequence having alternating layers of a doped silicon layer and a germanium-containing layer, the layers of the layer sequence being deposited in a common reactor, the layers of doped silicon being formed by in situ doped deposition of polysilicon, and the germanium-containing layers being formed by deposition of germanium;

exposing by anisotropic etching the surface of the semiconductor substrate in a region of the trench floor;

forming a support structure that extends up to a floor of the trench by whole-surface deposition of an electrically conductive layer that fills the trench, and by anisotropic back-etching of the electrically conductive layer;

removing the germanium-containing layers by selective etching to the layers of doped silicon and the support structure;

providing an exposed surface of the layers of doped silicon and the support structure with a capacitor dielectric; and forming a counter-electrode on a surface of the capacitor dielectric.

11. The method according to claim 10, wherein the layer sequence in the trench is produced by whole-surface deposition of the layers in the layer sequence;

wherein parts of the layers, in the layer sequence, parallel to the main surface are subsequently removed by anisotropic etching, whereby the surface of the semiconductor substrate is exposed in the region of the trench floor; and wherein the support structure is formed by whole-surface deposition of an electrically conductive layer that respectively fills the trenches, and by anisotropic back-etching of the electrically conductive layer.

12. The method according to claim 10, wherein each of the germanium-containing layers consists of a germanium portion between 10 and 100 mol %, and a silicon portion between 90 and 0 mol %.

13. The method according to claim 10, wherein, before application of the layer sequence, a doped region is formed in a surface of the trench, said doped region being connected electrically and mechanically with the support structure.

* * * * *